US012593576B2

(12) United States Patent (10) Patent No.: US 12,593,576 B2
Li et al. (45) Date of Patent: Mar. 31, 2026

(54) DISPLAY PANEL AND DISPLAY DEVICE

(71) Applicants: YUNNAN INVENSIGHT OPTOELECTRONICS TECHNOLOGY CO., LTD., Kunming (CN); BOE TECHNOLOGY GROUP CO., LTD., Beijing (CN)

(72) Inventors: Yunlong Li, Beijing (CN); Pengcheng Lu, Beijing (CN); Kuanta Huang, Beijing (CN); Wei Liu, Beijing (CN); Dacheng Zhang, Beijing (CN)

(73) Assignees: YUNNAN INVENSIGHT OPTOELECTRONICS TECHNOLOGY CO., LTD., Kunming (CN); BOE TECHNOLOGY GROUP CO., LTD., Beijing (CN)

( * ) Notice: Subject to any disclaimer, the term of this patent is extended or adjusted under 35 U.S.C. 154(b) by 562 days.

(21) Appl. No.: 17/789,010

(22) PCT Filed: Sep. 16, 2021

(86) PCT No.: PCT/CN2021/118752
§ 371 (c)(1),
(2) Date: Jun. 24, 2022

(87) PCT Pub. No.: WO2023/039792
PCT Pub. Date: Mar. 23, 2023

(65) Prior Publication Data
US 2024/0224635 A1 Jul. 4, 2024

(51) Int. Cl.
*H10K 59/131* (2023.01)
*H10K 59/122* (2023.01)

(52) U.S. Cl.
CPC ......... *H10K 59/131* (2023.02); *H10K 59/122* (2023.02)

(58) Field of Classification Search
CPC ........................... H10K 59/131; H10K 59/122
See application file for complete search history.

(56) References Cited

U.S. PATENT DOCUMENTS

2016/0181332 A1* 6/2016 Park ..................... H10K 50/856
257/88
2019/0058022 A1* 2/2019 Baik ..................... H10K 59/124

FOREIGN PATENT DOCUMENTS

CN 111668381 A 9/2020

OTHER PUBLICATIONS

Indian First Office Action, Application No. 202327061649, dated Oct. 28, 2025, 5 pps.: with English translation.

* cited by examiner

*Primary Examiner* — Jay C Kim
*Assistant Examiner* — Woo K Lee
(74) *Attorney, Agent, or Firm* — Armstrong Teasdale LLP

(57) ABSTRACT

Embodiments of the present disclosure relates to a display panel and a display device. The display panel includes a substrate in which a plurality of grooves are arranged, and a plurality of first electrodes alternately arranged with the plurality of grooves on the substrate, each of the first electrodes including a first conductive part on the substrate, a distance from an edge of the first conductive part to a plane where a side wall of the groove closest to the edge is located is greater than 0 and smaller than a thickness of the first conductive part.

18 Claims, 5 Drawing Sheets

700

DISPLAY PANEL AND DISPLAY DEVICE

CROSS REFERENCE TO RELATED APPLICATIONS

This patent application is a National Stage Entry of PCT/CN2021/118752 filed on Sep. 16, 2021, the disclosure of which is incorporated by reference herein in its entirety as part of the present application.

BACKGROUND

The present disclosure relates to the field of display technology, and in particular, to a display panel and a display device.

An Organic Light-Emitting Diode (OLED) display device, also known as an organic electroluminescent display device, is a display device different from a traditional liquid crystal display (LCD). Such a display technology has the advantages of simple structure, self-luminescence, high contrast, thin thickness, wide viewing angle, fast response speed, and being capable of being used for flexible panels. Therefore, it has become one of the important development directions of a new generation of display devices, and has received more and more attention.

However, due to reasons such as the manufacturing process, the performance of the OLED display device still needs to be improved.

BRIEF DESCRIPTION

Embodiments of the present disclosure provide a display panel and a display device.

An aspect of the present disclosure provides a display panel including a substrate in which a plurality of grooves are arranged, and a plurality of first electrodes alternately arranged with the plurality of grooves on the substrate, each of the first electrodes including a first conductive part on the substrate, wherein a distance from an edge of the first conductive part to a plane where a side wall of the groove closest to the edge is located is greater than 0 and smaller than a thickness of the first conductive part.

In one or more embodiments of the present disclosure, each of the first electrodes further includes a second conductive part on the first conductive part and surrounding the first conductive part together with the substrate, the distance from the edge of the first conductive part to the plane where the side wall of the groove closest to the edge is located is substantially equal to a thickness of the second conductive part.

In one or more embodiments of the present disclosure, the display panel further includes a second electrode located on a side of the first electrode away from the substrate, wherein the second electrode is electrically isolated from the plurality of first electrodes, and wherein the distance from the edge of the first conductive part to the plane where the side wall of the groove closest to the edge is located is smaller than a thickness of the second electrode.

In one or more embodiments of the present disclosure, second electrode includes a plurality of first depression parts and a plurality of first flat parts alternately arranged with the plurality of first depression parts, wherein the plurality of first flat parts correspond to the plurality of first electrodes and an orthographic projection of each first flat part on the substrate is located within an orthographic projection of the corresponding first electrode on the substrate, and wherein the plurality of first depression parts correspond to the plurality of grooves and an orthographic projection of each first depression part on the substrate at least covers an orthographic projection of the corresponding groove on the substrate.

In one or more embodiments of the present disclosure, each first depression part includes a first inclined surface, a second inclined surface, and a first bottom surface connecting the first inclined surface and the second inclined surface, wherein a slope of the first inclined surface and a slope of the second inclined surface are equal in magnitude, and an extending surface of the first inclined surface and an extending surface of the second inclined surface intersect on a side of the first bottom surface close to the substrate.

In one or more embodiments of the present disclosure, the first bottom surface protrudes toward a side facing away from the substrate.

In one or more embodiments of the present disclosure, the first bottom surface includes a third inclined surface, a fourth inclined surface, and a first sub-bottom surface connecting the third inclined surface and the fourth inclined surface, wherein a slope of the third inclined surface and a slope of the fourth inclined surface are equal in magnitude, an extending surface of the third inclined surface and an extending surface of the fourth inclined surface intersect on a side of the first sub-bottom away from the substrate, and wherein the third inclined surface connects the first inclined surface and the first sub-bottom surface, and the fourth inclined surface connects the second inclined surface and the first sub-bottom surface.

In one or more embodiments of the present disclosure, a distance from the lowest point of the first bottom surface to a plane where the side wall of the groove closest to the lowest point is located is smaller than a sum of the thickness of the first conductive part and the thickness of the second conductive part.

In one or more embodiments of the present disclosure, the distance from the lowest point of the first bottom surface to the plane where the side wall of the groove closest to the lowest point is located is smaller than the thickness of the first conductive part.

In one or more embodiments of the present disclosure, the first sub-bottom is substantially flat.

In one or more embodiments of the present disclosure, a width of the first bottom surface is greater than a width of any one of the first inclined surface and the second inclined surface in a plane perpendicular to an extending direction of the groove.

In one or more embodiments of the present disclosure, widths of the first inclined surface and the second inclined surface in a plane perpendicular to an extending direction of the groove are smaller than 3 times a total thickness of the first conductive part and the second conductive part.

In one or more embodiments of the present disclosure, widths of the first inclined surface and the second inclined surface in the plane perpendicular to the extending direction of the groove are smaller than the total thickness of the first conductive part and the second conductive part.

In one or more embodiments of the present disclosure, each groove includes two side walls and a bottom wall connecting the two side walls, the bottom wall including a fifth inclined surface, a sixth inclined surface and a sub-bottom wall connecting the fifth inclined surface and the sixth inclined surface, wherein a slope of the fifth inclined surface and a slope of the sixth inclined surface are equal in magnitude, and an extending surface of the fifth inclined surface and an extending surface of the sixth inclined surface intersect on a side of the sub-bottom wall away from the substrate.

In one or more embodiments of the present disclosure, in a plane perpendicular to an extending direction of the groove, a width of the fifth inclined surface is smaller than a width of the first inclined surface, and a width of the sixth inclined surface is smaller than a width of the second inclined surface.

In one or more embodiments of the present disclosure, in the plane perpendicular to the extending direction of the groove, the width of the fifth inclined surface is smaller than a width of the third inclined surface and the width of the sixth inclined surface is smaller than a width of the fourth inclined surface.

In one or more embodiments of the present disclosure, an edge of the second conductive part is aligned with a side of the groove closest to the edge.

In one or more embodiments of the present disclosure, the second conductive part includes an intermediate part located on the first conductive part, an orthographic projection of the intermediate part on the substrate being within an orthographic projection of the first conductive part on the substrate, side-wall parts on both sides of the intermediate part, respectively, and an extending part extending along a surface of the substrate from the side-wall part to the side of the groove.

In one or more embodiments of the present disclosure, the display panel further includes a pixel definition layer including a plurality of openings corresponding to the plurality of first electrodes, respectively, and a plurality of second depression parts corresponding to the plurality of grooves, respectively, wherein each opening exposes at least a part of the corresponding first electrode, and each first depression part covers the side wall and bottom wall of the corresponding groove and extends to the first electrodes located on both sides of the corresponding groove, and a light-emitting functional layer located between the pixel definition layer and the second electrode, the light-emitting layer covering the pixel definition layer and the parts of the first electrode exposed by the plurality of openings.

In one or more embodiments of the present disclosure, the first conductive part includes a flat layer and/or a buffer layer on the substrate, and a reflective layer on the flat layer and/or the buffer layer.

Another aspect of the present disclosure further provides a display device including the display panel described in any one of the one or more embodiments of the present disclosure.

Further aspects and areas of applicability will become apparent from the description provided herein. It should be understood that various aspects of this application may be implemented individually or in combination with one or more other aspects. It should also be understood that the description and specific examples herein are intended for purposes of illustration only and are not intended to limit the scope of the present application.

BRIEF DESCRIPTION OF THE DRAWINGS

The drawings described herein are for illustrative purposes only of selected embodiments and not all possible implementations, and are not intended to limit the scope of the present application, in which.

Corresponding reference numerals indicate corresponding parts or features throughout the several views of the drawings.

DETAILED DESCRIPTION

Figure 1:
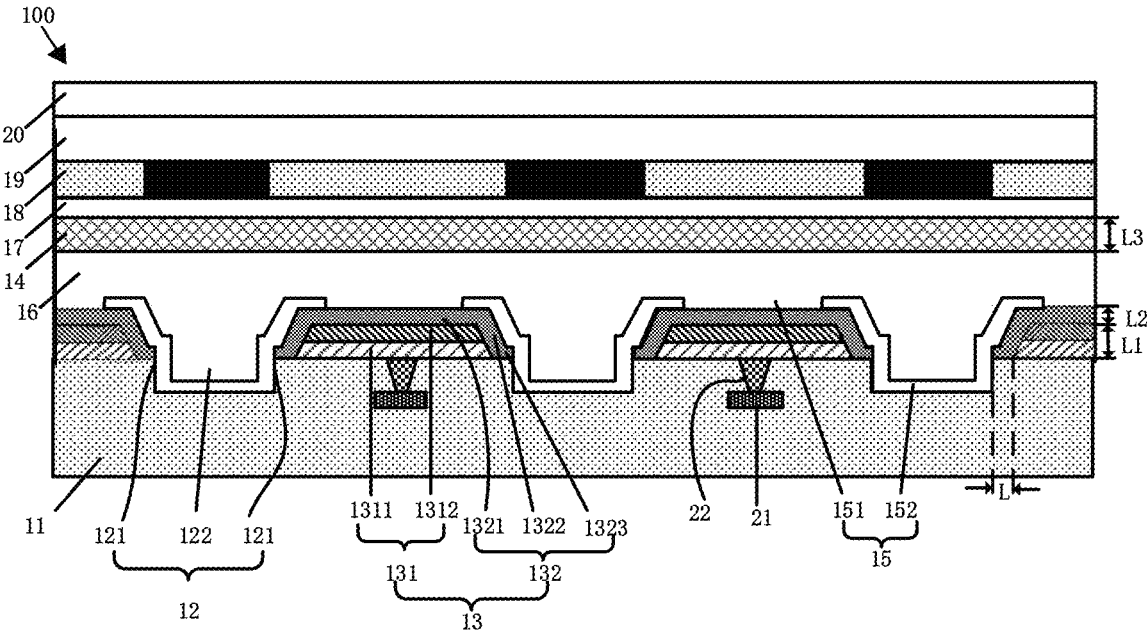
FIG. 1 schematically illustrates a display panel according to one or more embodiments of the present disclosure.

Various embodiments will now be described in detail with reference to the drawings, which are provided as illustrative examples of the disclosure so as to enable those skilled in the art to practice the disclosure. Notably, the figures and the examples below are not meant to limit the scope of the present disclosure. Where certain elements of the present disclosure may be partially or fully implemented using known components, only those parts of such known components that are necessary for an understanding of the present disclosure will be described, and the detailed descriptions of other parts of such known components will be omitted so as not to obscure the disclosure. Further, various embodiments encompass present and future known equivalents to the components referred to herein by way of illustration.

As used herein, the expressions "have", "comprise" and "contain" as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents, or elements are present in A. The terms "a", "an", "the", "said" and "at least one" are used to mean that there are one or more elements/components/etc.

As used herein, the term "be located on" does, however, not refer to a specific geometric orientation of the final stack in the display panel or the display device with respect to a direction of a gravitational force but rather indicates a way of manufacturing the stack, which, after manufacturing, could, in general, be placed in any geometric orientation, also such as turned upside down. The terms "first", "second", "third", etc. are used for descriptive purposes only and should not be construed to indicate or imply relative importance and order of formation.

In the related art, an OLED display panel generally includes a substrate, a cathode, an anode, a hole injection layer (HIL), an electron injection layer (EIL), a hole transport layer (HTL), an electron transport layer (ETL), a light emitting layer (EML), and other parts. Under the action of the electric field, the holes generated by the anode and the electrons generated by the cathode will move, be injected into the hole transport layer and the electron transport layer, respectively, and migrate to the light-emitting layer. In the case that they meet in the light-emitting layer, energy excitons are generated, thereby exciting the light-emitting molecules to finally produce visible light.

The aperture ratio is an important indicator to measure the performance of the display panel. Aperture ratio refers to a ratio between the area of the light passing part of each pixel except the areas corresponding to the opaque components such as the wiring part and the transistor part (usually hidden by a black matrix) of each pixel and the overall area of each pixel. The higher the aperture ratio, the higher the efficiency of light transmitting is. The display panel in the related art usually has a problem that the aperture ratio is low.

The present disclosure provides a display panel and a display device, which may improve the aperture ratio by reasonably setting the relative positions and relative sizes of elements. As an example, the aperture ratio may be improved by setting a specific relationship between a distance of the first conductive part (for example, the Ti/Ag layer or the Ti/Al/Ti layer) of the first electrode (for example, the anode) of the display panel to the edge of the groove and a thickness of the first conductive part.

In an embodiment of the present disclosure, a display panel is provided, including a substrate in which a plurality of grooves are arranged, and a plurality of first electrodes alternately arranged with the plurality of grooves on the substrate, each of the first electrodes including a first conductive part on the substrate, wherein a distance from an edge of the first conductive part to a plane where a side wall of the groove closest to the edge is located is greater than 0 and less than a thickness of the first conductive part. In the embodiments of the present disclosure, due to a relatively small distance between the edge of the first conductive part and the side wall of the groove, the first electrode may occupy a larger area, thereby increasing the aperture ratio of the display panel.

FIG. 1 schematically illustrates a display panel according to one or more embodiments of the present disclosure. As illustrated in FIG. 1, the display panel 100 includes a substrate 11 in which a plurality of grooves 12 are arranged, a plurality of first electrodes alternately arranged with the plurality of grooves 12 on the substrate 13, each of the first electrodes 13 including a first conductive part 131 on the substrate 11. In some embodiments of the present disclosure, a distance L from an edge of the first conductive part 131 to a plane where a side wall of the groove 12 closest to the edge is located is greater than 0 and less than a thickness L1 of the first conductive part 131. As an example, the distance L from the edge of the first conductive part 131 to the plane where the side wall of the groove 12 closest to the edge is located is less than 100 nm, 50 nm, or 20 nm. As a further example, the distance L from the edge of the first conductive part 131 to the plane where the side wall of the groove 12 closest to the edge is located may be less than 1/5, 1/2, or 4/5, and so on of the thickness L1 of the first conductive part 131.

It should be understood that the parameter "thickness" may refer to the thickness of a component (for example, the first conductive part) in a direction perpendicular to the substrate 11, in the embodiments of the present disclosure. It should also be understood that FIG. 1 only schematically illustrates the distance L from the left edge of the first conductive part to the plane where the right side wall of the groove closest to the left edge is located. For other edges of the first conductive part (for example, the right edge), it also works.

In some embodiments of the present disclosure, the material of the substrate 11 may be a semiconductor material such as monocrystalline silicon or polycrystalline silicon. In alternative embodiments, the substrate 11 may also be made of other hard or soft materials such as glass, plastic, and the like.

In some embodiments of the present disclosure, each groove 12 may include two side walls 121 and a bottom wall 122 connecting the two side walls 121. The two side walls 121 may be arranged in parallel. In alternative embodiments, the two side walls 121 may form an angle. That is, their extending surfaces may intersect. In the embodiment illustrated in FIG. 1, the bottom wall 122 may be substantially flat in a plane parallel to the substrate 11. It is understood that the bottom wall 122 of the groove 12 may also be a curved surface, for example, a curved surface that protrudes in a direction away from the substrate.

Some of the plurality of grooves 12 may be spaced in a first direction, and other of the plurality of grooves 12 may be spaced in a second direction that is different (for example, perpendicular) to the first direction. With this configuration, the plurality of grooves 12 may divide the substrate 11 into a plurality of pixel regions distributed in an array, so as to subsequently form pixels, on the pixel regions, for emitting light of different colors. In an alternative embodiment, the plurality of grooves 12 may be spaced only in the first direction or the second direction to form a strip-shaped pixel region.

In some embodiments, the shape of the orthographic projection of the pixel region on the substrate 11 may be a rectangle, a pentagon, a hexagon, or other polygons depending on different extending directions of the grooves 12. Of course, it may also be circular or other shapes, which are not particularly limited herein. Meanwhile, the shapes and sizes of different pixel regions may be different.

In some embodiments of the present disclosure, the first conductive parts 131 of the plurality of first electrodes 13 may be located on the substrate 11 at intervals, especially in the respective pixel regions of the substrate 11. The plurality of first conductive parts 131 are alternately arranged with the plurality of grooves 12, and each of the first conductive parts 131 has a distance L that is not 0 from the grooves 12 in a direction parallel to the surface of the substrate 301.

In some embodiments of the present disclosure, the first conductive part 131 may include a first layer 1311 on the substrate 11 and a second layer 1312 on the first layer 1311. The first layer 1311 may function as a planarization layer and/or a buffer layer, and the second layer 1312 may function as a reflective layer. The reflective layer may reflect the light from the light-emitting functional layer toward a direction of the second electrode of the OLED display device, and the second electrode may also reflect some of the light back. In this way, in the case that the wavelength of the light and the distance between the first electrode and the second electrode satisfy certain conditions, such as resonance conditions, the intensity of a part of the light propagating between the first electrode and the second electrode may be enhanced, which is beneficial to improve the brightness of the light-emitting device.

In an exemplary embodiment, the first layer 1311 may include titanium (Ti), which is selected as the planarization layer and the buffer layer to increase the adhesion between the first electrode and the substrate; and the second layer 1312 may include silver (Ag), which is selected as the reflective layer to prevent chemical reaction between this layer and the layer above it from forming compounds.

In an alternative embodiment, the first conductive part 131 may also include three layers. Specifically, the first conductive part 131 may include a first layer on the substrate, a second layer on the first layer, and a third layer on the second layer. The first layer may include titanium (Ti), the second layer may include aluminum (Al), and the third layer may include (Ti).

In other embodiments of the present disclosure, as illustrated in FIG. 1, the first electrode 13 may further include a second conductive part 132 located on the first conductive part 131 and surrounding the first conductive part 131 together with the substrate 11. In an embodiment of the present disclosure, the distance L from the edge of the first conductive part 131 to the plane where the side wall of the groove 12 closest to the edge is located may be substantially equal to a thickness L2 of the second conductive part 132. It should be noted that, in the embodiments of the present disclosure, "substantially equal to" means to allow a certain range of error between the two parameter values, for example, an error of less than 10%, such as 2%, 5% or 8%.

In some embodiments of the present disclosure, a distance between two adjacent second conductive parts 132 in the direction parallel to the substrate 11 is equal to the width of the groove 12 and an edge of the second conductive part 132 is aligned with a side of the groove closest to the edge. Specifically, an orthographic projection of a gap between adjacent second conductive parts 132 on the substrate 11 may completely coincide with an orthographic projection of the groove 12 between the adjacent second conductive parts 132 on the substrate 11. With this configuration, in preparing a display panel, especially the first electrode of the display panel, the second conductive layer may be deposited first, and then parts of the second conductive layer and parts of the substrate may be simultaneously etched using a mask to simultaneously form the second conductive parts 132 and the grooves 12, thereby simplifying the process steps and improving the productivity. In addition, since the second conductive parts 132 and the grooves 12 in the substrate 11 are formed in one etching using the same mask, an over lay at the region of the substrate 11 between the groove 12 and the second conductive part 132 resulting from etching deviation may be avoided, so that the process risk may be reduced to improve the performance of the display panel.

In an exemplary embodiment, as illustrated in FIG. 1, the second conductive part 132 may include an intermediate part 1321 located on the first conductive part 131, and an orthographic projection of the intermediate part 1321 on the substrate 11 is within an orthographic projection of the first conductive part 131 on the substrate 11, side wall parts 1322 on both sides of the intermediate part 1321 and immediately adjacent to the first conductive part 131, an extending part 1323 extending along the surface of the substrate 11 from a side wall part 1322 to an edge of the adjacent groove 12.

In this exemplary embodiment, the intermediate part 1321 of the second conductive part 132 and the side wall parts 1322 on both sides may surround the corresponding first conductive part 131 together with the substrate 11 under the first conductive part 131, so that the first conductive part may not interfere with the electric field between the second conductive part and the second electrode. The extending part 1323 of the second conductive part 132 may extend on the surface of the substrate 11 to the edge of the groove 12, so that there may be an opening exposing the groove 12 between adjacent second conductive parts 132. With this configuration, in preparing such a display panel, the second conductive part 132 and the groove 12 may be simultaneously formed by one etching using one mask, which may reduce process steps and may eliminate process risks caused by machine coverage, as described above.

In exemplary embodiments, the material of the second conductive part 132 may include indium tin oxide (ITO) or other conductive materials.

In some embodiments of the present disclosure, the display panel 100 further includes a second electrode 14 located on a side of the first electrode 13 away from the substrate 11, and the second electrode 14 is electrically insulated from the plurality of first electrodes 13. As will be described in detail below, the second electrode 14 and the first electrode 13 may be electrically isolated by a light-emitting functional layer.

In some embodiments, the distance L from the edge of the first conductive part 131 to the plane where the side wall of the groove 12 closest to the edge is located is smaller than the thickness L3 of the second electrode 14. As an example, the distance L from the edge of the first conductive part 131 to the plane where the side wall of the groove 12 closest to the edge is located is less than ⅕, ½, or ⅘ of the thickness of the second electrode 14.

In some embodiments of the present disclosure, the second electrode 14 may be substantially flat in the plane parallel to the substrate 11. In an alternative embodiment, the second electrode 14 may be recessed toward the direction of the substrate 11 at positions corresponding to the plurality of grooves 12. The material of the second electrode 14 may be an alloy material. As an example, the material of the second electrode 14 may include Mg and Ag; alternatively, the second electrode 14 may also adopt an Al and Li alloy. Of course, the second electrode 14 may also use other alloys or homojunction metals, which will not be listed one by one herein.

In some embodiments of the present disclosure, as illustrated in FIG. 1, the display panel 100 further includes a pixel definition layer 15 on at least a part of the first electrode and in the groove, and a light-emitting functional layer 16 between the pixel definition layer 15 and the second electrode 14.

In an exemplary embodiment, the pixel definition layer 15 includes a plurality of openings 151 corresponding to the plurality of first electrodes 12, respectively, and a plurality of second depression parts 152 corresponding to the plurality of grooves 12, respectively, each of the openings 151 exposing at least a part of the corresponding first electrode 13 (specifically, the second conductive part 132), and each first depression parts 153 covering the side wall 121 and the bottom wall 122 of the corresponding groove 12 and a part of the first electrode 13 (specifically, the second conductive part 132) on both sides of the corresponding groove 12. In preparing the pixel definition layer 15, the pixel definition layer 15 may be conformally deposited on the second conductive part 132 and in the groove 12 between the second conductive parts 132, and then a part of the pixel definition layer 15 may be removed (for example, etched), thereby forming the plurality of openings 151 and the plurality of second depression parts 152. In some embodiments of the present disclosure, the pixel definition layer 15 may be formed of an insulating material.

The light-emitting functional layer 16 may be a continuous film layer and cover the parts of the pixel definition layer 15 and the first electrode 13 exposed by the plurality of openings. The light emitting functional layer may be deposited on the accessible surfaces of the pixel definition layer 15 and the first electrode 13 by evaporation or other processes. In one or more embodiments, the light-emitting functional layer 16 fills the second depression parts 152 of the pixel definition layer 15 and extends toward the second electrode 15 by a thickness. The light emitting functional layer 16 may have a recess toward the substrate in a region corresponding to the second depression parts 152. The light-emitting functional layer may include a hole injection layer, a hole transport layer, a light-emitting layer, an electron transport layer, and an electron injection layer stacked in order from the first electrode 13 toward the direction away from the substrate 11.

A plurality of pixels distributed in an array may be defined by the plurality of openings 151 and the plurality of second depression parts 152 of the pixel definition layer 15. Each pixel may include at least a first electrode 13, a part of the light emitting functional layer 16 corresponding to a part of the second conductive part 132 exposed by the opening 151, a part of the second electrode 14 corresponding to a part of the second conductive part 132 exposed by the opening 151 in the embodiment of the present disclosure. The plurality of second depression parts 152 may serve as spacers between different pixels to reduce pixel cross-color.

In some embodiments of the present disclosure, as illustrated in FIG. 1, the display panel 100 may further include a first encapsulation layer 17, a color filter layer 18, a second encapsulation layer 19, and a transparent cover plate 20.

The first encapsulation layer 17 is located on the second electrode 14 and covers the second electrode 14. The first encapsulation layer 17 may include a plurality of first sub-encapsulation layers. As an example, the first encapsulation layer 14 may include two inorganic layers and an organic layer between the two inorganic layers.

The color filter layer 18 is disposed on a side of the first encapsulation layer 17 facing away from the second electrode 14. The color filter layer 18 may include a plurality of color filter regions distributed in an array corresponding to the plurality of first electrodes 13, such as a red filter region, a green filter region, and a blue filter region.

The second encapsulation layer 19 may cover the color filter layer 18. The second encapsulation layer 19 may include a plurality of second sub-encapsulation layers. As an example, the second encapsulation layer may include an inorganic layer and an organic layer.

The transparent cover plate 20 may cover the second encapsulation layer 19. The transparent cover plate 20 may include a glass or a transparent polymer material.

In some optional embodiments of the present disclosure, the display panel 100 may further include a wiring layer in the substrate 11, the wiring layer including a plurality of wiring parts 21, and a plurality of via holes 22 in the substrate 11 for connecting the plurality of first conductive parts 131 and the plurality of wiring parts 21. As a non-limiting example, the plurality of first conductive parts 131 and the plurality of wiring parts 21 may be connected by depositing a metal material (for example, tungsten) in the via holes 22.

Figure 2:
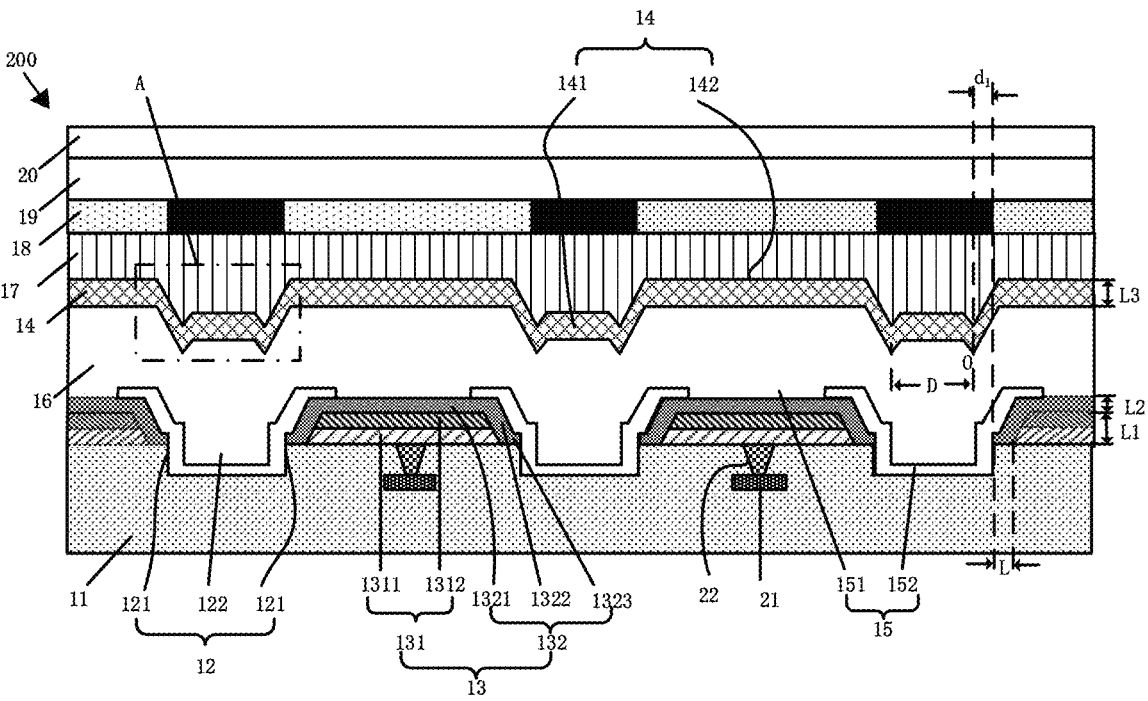
FIG. 2 schematically illustrates another display panel according to one or more embodiments of the present disclosure.

FIG. 2 schematically illustrates another display panel 200 according to one or more embodiments of the present disclosure. The display panel 200 illustrated in FIG. 2 shares some similarities with the display panel 100 illustrated in FIG. 1, and the description provided with respect to FIG. 1 is applicable to the display panel 200 illustrated in FIG. 2 as appropriate. Therefore, in the following description, only the different parts from the embodiments illustrated in FIG. 1 are described, and the same parts as the embodiments illustrated in FIG. 1 are omitted.

In an embodiment illustrated in FIG. 2, the second electrode 14 may include a plurality of first depression parts 141 and a plurality of first flat parts 142 alternately arranged with the plurality of first depression parts 141. In an exemplary embodiment, the plurality of first depression parts 141 correspond to the plurality of grooves 12, and an orthographic projection of each depression part 141 on the substrate 11 at least covers that of the corresponding groove 12 on the substrate 11. The plurality of first flat parts 142 correspond to the plurality of first electrodes 13 and an orthographic projection of each flat part 143 on the substrate 11 is within that of the corresponding first electrode 13 on the substrate 11. In an exemplary embodiment, a width of the orthographic projection of each first depression part 141 on the substrate 11 is larger than that of the orthographic projection of the corresponding groove 12 on the substrate 11 but smaller than that of the orthographic projection of the second depression part 152 of the pixel definition layer 15, and a width of the orthographic projection of each flat part 142 on the substrate 11 is smaller than that of the orthographic projection of the corresponding first electrode 13 (specifically, the second conductive part 132 of the first electrode 13) on the substrate 11. With this configuration, the orthographic projection of the first depression part 141 of the second electrode 14 on the substrate 11 does not overlap with that of the part of the first electrode 13 exposed by the opening of the pixel definition layer 15 on the substrate 11, and thus an electric field generated between the first depression part 141 of the second electrode 14 and the part of the first electrode 13 exposed by the pixel definition layer 15 would not excite the part of the light-emitting layer corresponding to the groove to emit light, thereby effectively preventing Crosstalk between adjacent pixels.

Figure 3:
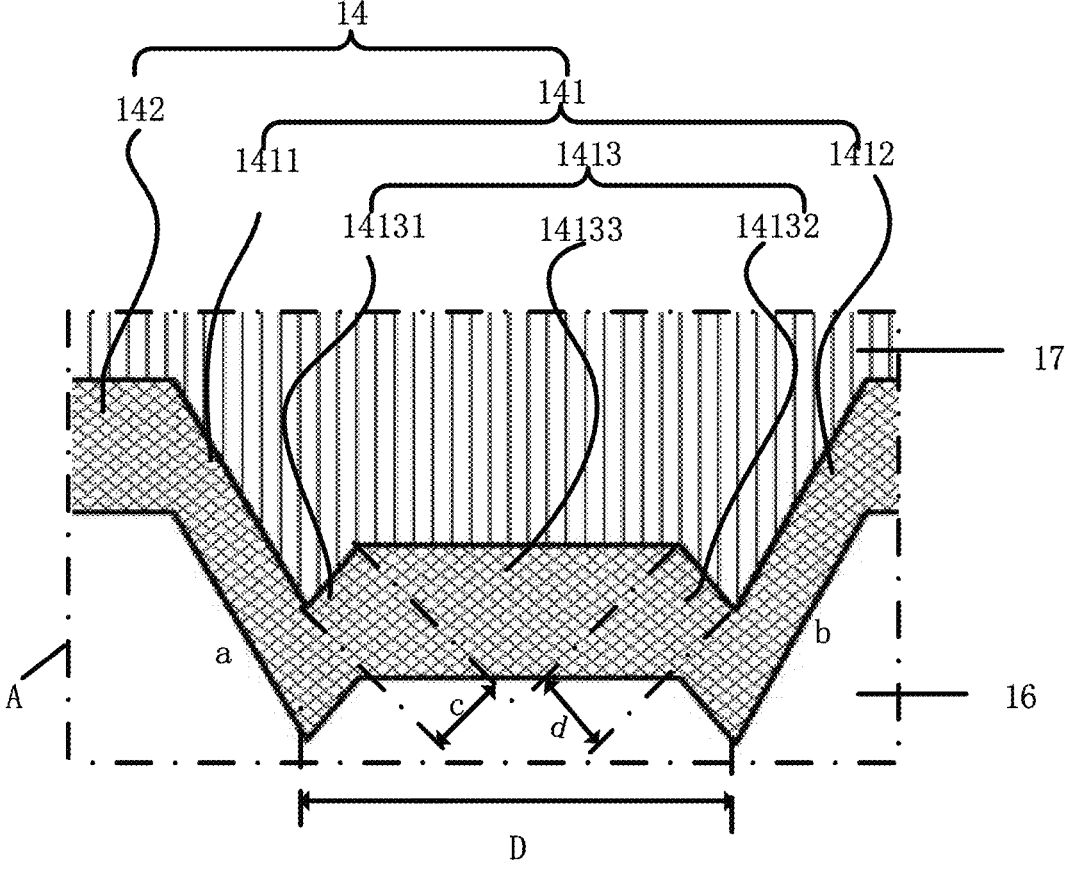
FIG. 3 is an enlarged view of the dotted line frame A in FIG. 2.

FIG. 3 is an enlarged view of the dotted frame A in FIG. 2. As illustrated in FIGS. 2 and 3, each first depression part 141 may include a first inclined surface 1411, a second inclined surface 1412 and a first bottom surface 1413 connecting the first inclined surface 1411 and the second inclined surface 1412 in one or more embodiments of the present disclosure. A slope of the first inclined surface 1411 and a slope of the second inclined surface 1412 are opposite in sign and equal in magnitude. In this embodiment, an extending surface of the first inclined surface 1411 and an extending surface of the second inclined surface 1412 intersect on a side of the first bottom surface 1413 close to the substrate 11. In other words, the extending surface of the first inclined surface 1411 and the extending surface of the second inclined surface 1412 intersect, and the intersection line is below the first bottom surface 1413. With this configuration, the first depression part 141 may have a shape that gradually decreases in the direction from the top to the bottom of the opening.

In some embodiments of the present disclosure, it may protrude toward a side facing away from the substrate 11. The first bottom surface 1413 may be a curved surface protruding toward a direction away from the substrate 11. For example, the contour of the first bottom surface 1413 may be substantially arc-shaped, parabolic, wavy, or other regular or irregular shapes protruding toward the direction away from the substrate.

In an exemplary embodiment, the first bottom surface 1413 may include a third inclined surface 14131, a fourth inclined surface 14132, and a first sub-bottom surface 14133 connecting the third inclined surface 14131 and the fourth inclined surface 14132. A slope of the third inclined surface 14131 and a slope of the fourth inclined surface 14132 are opposite in sign and equal in magnitude. An extending surface of the third inclined surface 14131 and an extending surface of the fourth inclined surface 14132 intersect on a side of the first sub-bottom surface 14133 away from the substrate 11. In other words, the extending surface of the third inclined surface 14131 intersects with the extending surface of the fourth inclined surface 14132, and the intersection line is above the first sub-bottom surface 14133. The third inclined surface 14131 connects the first inclined surface 1411 and the first sub-bottom surface 14133, and the fourth inclined surface 14132 connects the second inclined surface 1412 and the first sub-bottom surface 14133. The first sub-bottom surface 14133 is substantially flat. It may be understood that the first sub-bottom surface 14133 may also be an arc surface that protrudes in a direction away from the substrate 11.

In some embodiments of the present disclosure, as illustrated in FIG. 2, a distance $d_1$ from the lowest point of the first bottom surface 1413 (which is also the lowest point of the second electrode 14) to a plane where the side wall of the groove 12 closest to the lowest point is located is smaller than a sum (L1+L2) of the thickness of the first conductive part 131 and the thickness of the second conductive part 132, that is, smaller than the total thickness of the first electrode 13. In an embodiment illustrated in FIG. 2, the lowest point O of the first bottom surface 1413 is located on the intersection line of the third inclined surface 14131 and the first inclined surface 1411 and/or the intersection line of the fourth inclined surface 14132 and the second inclined surface 1412. In an exemplary embodiment, the distance $d_1$ from the lowest point of the first bottom surface 1413 to the plane where the side wall of the groove 12 closest to the lowest point is located is equal to 10%-90% of the sum (L1+L2) of the thickness of the first conductive part 131 and the thickness of the second conductive part 132, for example, 90%, 80%, 70%, or 50%.

In some embodiments of the present disclosure, the distance $d_1$ from the lowest point of the first bottom surface 1413 to the plane where the side wall of the groove 12 closest to the lowest point is located is smaller than the thickness L1 of the first conductive part 131. In an exemplary embodiment, the distance $d_1$ from the lowest point of the first bottom surface 1413 to the plane where the side wall of the groove 12 closest to the lowest point is located may be equal to 10%-90% of the thickness L1 of the first conductive part 131, for example, 90%, 80%, 70%, or 50%. With this configuration, the aperture ratio of the display panel may be increased.

In some embodiments of the present disclosure, in a plane perpendicular to the extending direction of the groove 12, i.e., in the paper plane illustrated in FIG. 2, a width D of the first bottom surface 1413 is greater than a width a or b of either of the first inclined surface 1411 and the second inclined surface 1412. With this configuration, crosstalk between adjacent pixels may be effectively prevented.

In some embodiments of the present disclosure, the width a or b of the first inclined surface 1411 and the second inclined surface 1412 in a direction perpendicular to the extending direction of the groove 12 is smaller than 3 times the total thickness of the first conductive part 131 and the second conductive part 132, i.e., less than 3*(L1+L2), in particular, smaller than the total thickness (L1+L2) of the first conductive part 131 and the second conductive part 132. As an example, the width a or b of the first inclined surface 1411 and the second inclined surface 1412 in the direction perpendicular to the extending direction of the groove 12 may be equal to 50%-90% of the total thickness (L1+L2) of the first conductive part 1411 and the second conductive part 1412, for example, 90%, 80%, 70%, or 50%.

Figure 4:
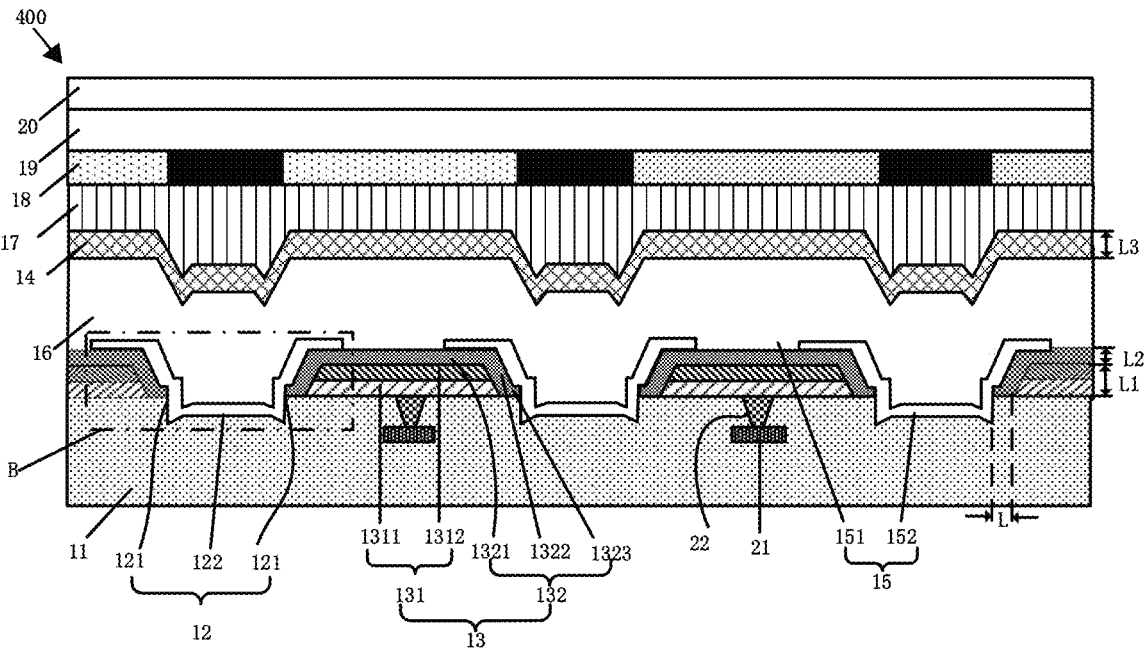
FIG. 4 schematically illustrates yet another display panel according to one or more embodiments of the present disclosure.

FIG. 4 schematically illustrates yet another display panel 400 according to one or more embodiments of the present disclosure. The display panel illustrated in FIG. 3 shares some similarities with the display panel illustrated in FIG. 2, and the description provided with respect to FIG. 2 is applicable to the display panel illustrated in FIG. 4 as appropriate. Therefore, in the following description, only the different parts from the embodiment shown in FIG. 2 are described, and the same parts as the embodiment shown in FIG. 2 are omitted.

In an embodiment illustrated in FIG. 4, each groove 12 may include two side walls 121 and a bottom wall 122 connecting the two side walls. As illustrated in FIG. 4, the bottom wall 122 of the groove 12 may protrude toward a direction away from the substrate 11. The bottom wall 122 may be a curved surface protruding toward a direction away from the substrate 11. For example, the contour of the bottom wall 122 may be substantially arc-shaped, parabolic, wavy, or other regular or irregular shape protruding away from the substrate.

Figure 5:
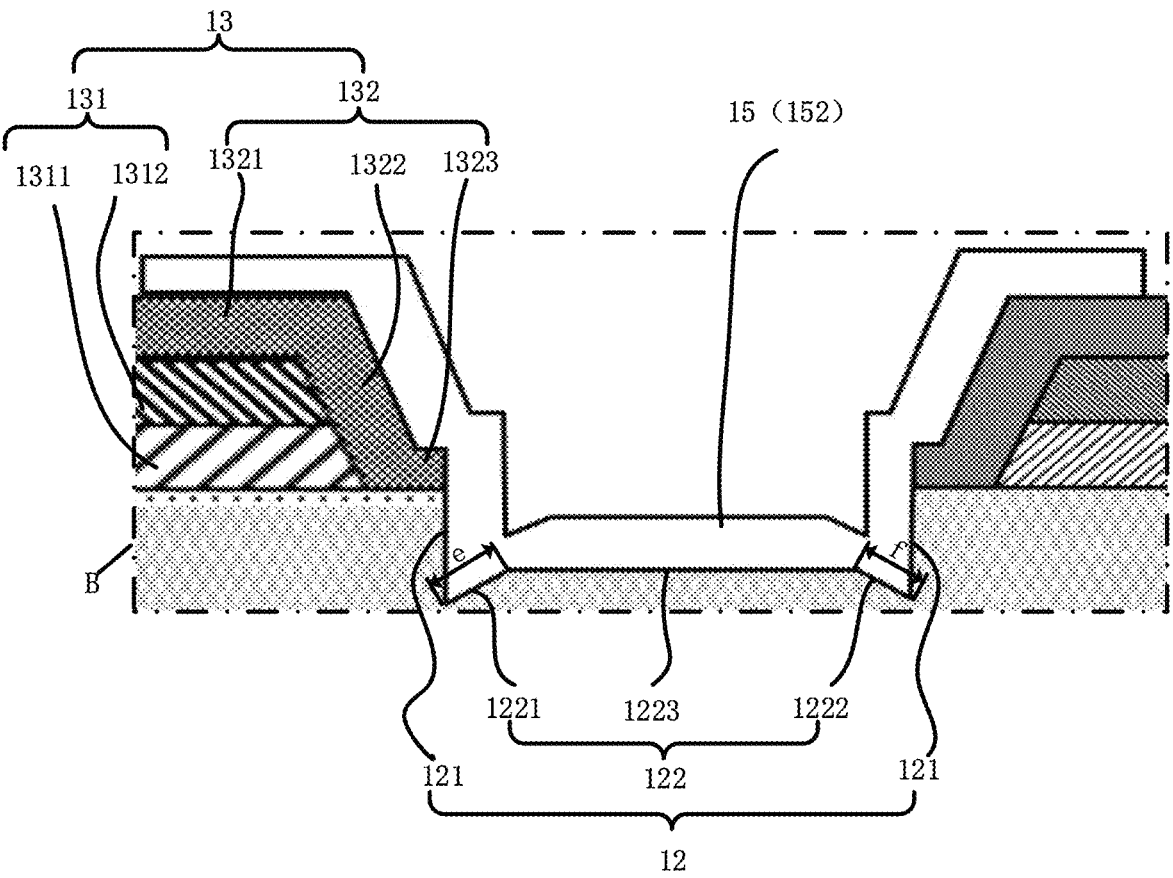
FIG. 5 is an enlarged view of the dotted line frame B in FIG. 4.

As an example, the bottom wall 122 of the groove 12 may have substantially the same shape as the first bottom surface 1413 in the embodiment illustrated in FIG. 2. FIG. 5 is an enlarged view of the dotted frame B in FIG. 4. In an exemplary embodiment, as illustrated in FIGS. 4 and 5, the bottom wall 122 may include a fifth inclined surface 1221, a sixth inclined surface 1222, and a sub-bottom wall 1223 connecting the fifth inclined surface 1221 and the sixth inclined surface 1222. A slope of the fifth inclined surface 1221 and a slope of the sixth inclined surface 1222 are opposite in sign and equal in magnitude, and an extending surface of the fifth inclined surface 1221 and an extending surface of the sixth inclined surface 1222 intersect on a side of the sub-bottom wall 1223 away from the substrate 11. In other words, the fifth inclined surface 1221 and the sixth inclined surface 1222 intersect, and the intersection line is located above the sub-bottom wall 1223.

In one or more embodiments of the present disclosure, as illustrated in FIGS. 3 and 5, in the plane perpendicular to the extending direction of the groove 12, a width e of the fifth inclined surface 1221 is smaller than a width a of the first inclined surface 1411, and a width f of the sixth inclined surface 1222 is smaller than a width b of the second inclined surface 1412. In an exemplary embodiment, the width e of the fifth inclined surface 1221 may be equal to ⅕-⅘ of the width a of the first inclined surface 1411, such as ⅕, ½, or ⅘, and the width f of the sixth inclined surface 1222 may be equal to ⅕-⅘ of the width b of the second inclined surface 1412, such as ⅕, ½, or ⅘.

In one or more embodiments of the present disclosure, in the plane perpendicular to the extending direction of the groove 12, the width e of the fifth inclined surface 1221 is smaller than a width c of the third inclined surface 14131, and the width f of the sixth inclined surface 1222 is smaller than a width d of the four inclined surface 14132. As an example, the width e of the fifth inclined surface 1221 may be equal to ⅕-⅘ of the width c of the third inclined surface 14131, such as ⅕, ½, ⅘, and the width f of the sixth inclined surface 1222 may be equal to ⅕-⅘ of the width d of the fourth inclined surface 14132, such as ⅕, ½, ⅘.

It should be noted that, in the embodiments of the present disclosure, the given numerical values and numerical ranges are merely exemplary, and cannot be construed as limitations of the present disclosure. Exemplary numerical values and numerical ranges may be modified without departing from the spirit and scope of the present disclosure.

Figure 6:
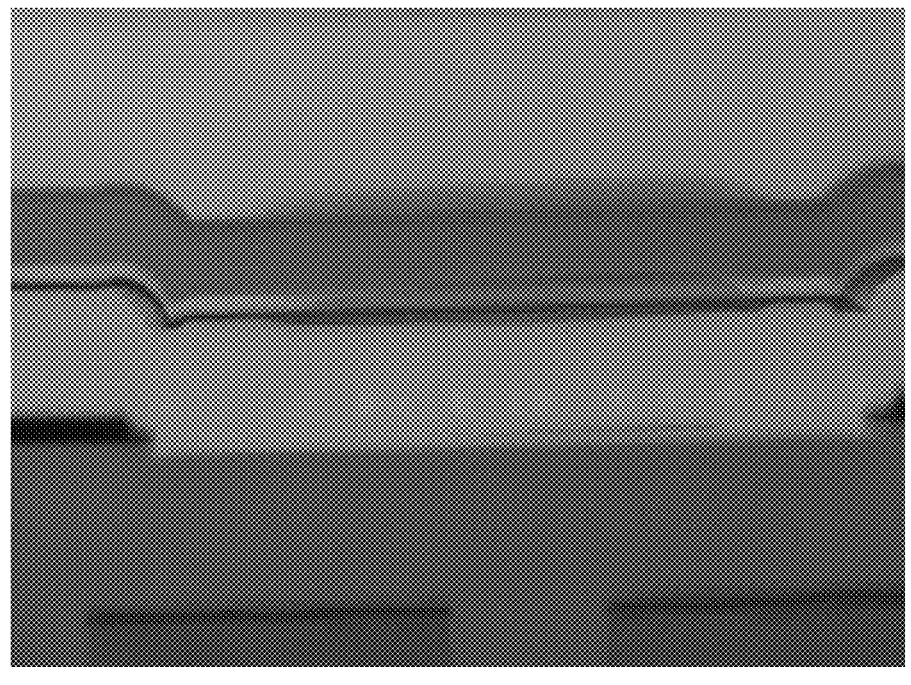
FIG. 6 schematically illustrates a partial electron microscope image of a display panel according to an embodiment of the present disclosure.

FIG. 6 schematically illustrates a partial electron microscope view of a display panel according to an embodiment of the present disclosure. In this electron microscope view, the substrate 11, the first conductive part 131, the second conductive part 132, the second electrode 14, and the light-emitting functional layer 16 of the display panel are shown. It can be seen from the electron microscope view that the distance L from the edge of the first conductive part 131 to the side wall of the groove 12 closest to the edge is smaller than the thickness of the first conductive part 131 or the second electrode 14. In an alternative embodiment, the distance L from the edge of the first conductive part 131 to the side wall of the groove 12 closest to the edge is substantially equal to the thickness of the second conductive part 132. The partial electron microscope view in FIG. 6 also shows other dimensional relationships among the various components of the display panel described in detail above.

Figure 7:
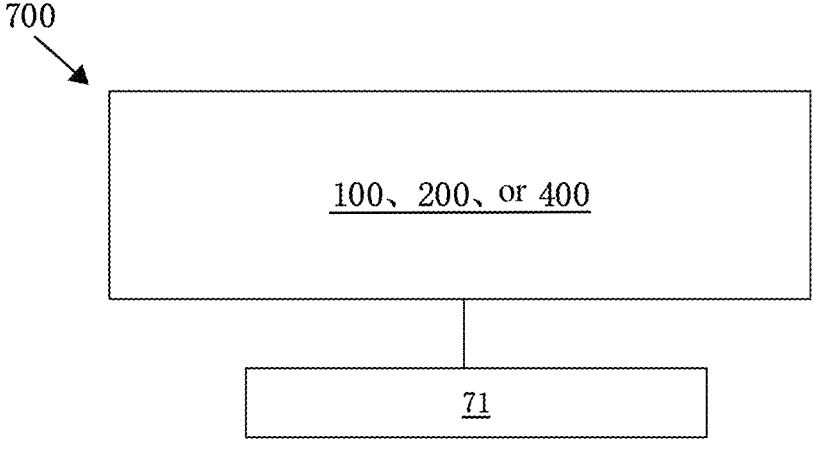
FIG. 7 schematically illustrates a display device 700 according to one or more embodiments of the present disclosure.

Embodiments of the present disclosure also provide a display device including a display panel according to one or more embodiments of the present disclosure, such as at least one of the one or more embodiments disclosed in detail above. Therefore, for alternative embodiments of the display device, reference may be made to the embodiments of the display panel. FIG. 7 schematically illustrates a display device 700 according to one or more embodiments of the present disclosure. As shown in FIG. 7, the display device 700 may include a display panel 100, 200, or 400 and a driving circuit 71 for providing driving signals for driving the display panel.

The foregoing description of the embodiment has been provided for purpose of illustration and description. It is not intended to be exhaustive or to limit the application. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the application, and all such modifications are included within the scope of the application.

What is claimed is:

1. A display panel comprising:
a substrate in which a plurality of grooves are arranged; and
a plurality of first electrodes alternately arranged with the plurality of grooves on the substrate, each of the first electrodes comprising:
a first conductive part on the substrate, wherein a distance from an edge of the first conductive part to a plane where a side wall of the groove closest to the edge is located is greater than 0 and smaller than a thickness of the first conductive part, wherein the first conductive part comprises a first layer on the substrate and a second layer on the first layer; and
a second conductive part on the first conductive part and surrounding the first conductive part together with the substrate, wherein an edge of the second conductive part is aligned with a side of the groove closest to the edge,
wherein the second conductive part comprises:
an intermediate part located on the first conductive part, wherein an orthographic projection of the intermediate part on the substrate is within an orthographic projection of the first conductive part on the substrate;
a side-wall part on a side of the intermediate part; and
an extending part extending along a surface of the substrate from the side-wall part to the side of the groove.

2. The display panel according to claim 1, wherein the distance from the edge of the first conductive part to the plane where the side wall of the groove closest to the edge is located is substantially equal to a thickness of the second conductive part.

3. The display panel according to claim 2, further comprising:
a second electrode located on a side of the first electrode away from the substrate, wherein the second electrode is electrically isolated from the plurality of first electrodes, and wherein the distance from the edge of the first conductive part to the plane where the side wall of the groove closest to the edge is located is smaller than a thickness of the second electrode.

4. The display panel according to claim 3, wherein the second electrode comprises a plurality of first depression parts and a plurality of first flat parts alternately arranged with the plurality of first depression parts, wherein the plurality of first flat parts correspond to the plurality of first electrodes, respectively, and an orthographic projection of each first flat part on the substrate is located within an orthographic projection of the corresponding first electrode on the substrate, and wherein the plurality of first depression parts correspond to the plurality of grooves, respectively, and an orthographic projection of each first depression part on the substrate at least covers an orthographic projection of the corresponding groove on the substrate.

5. The display panel according to claim 4, wherein each first depression part comprises a first inclined surface, a second inclined surface, and a first bottom surface connecting the first inclined surface and the second inclined surface, wherein a slope of the first inclined surface and a slope of the second inclined surface are equal in magnitude, and wherein an extending surface of the first inclined surface and an extending surface of the second inclined surface intersect on a side of the first bottom surface close to the substrate.

6. The display panel according to claim 5, wherein the first bottom surface protrudes toward a direction away from the substrate.

7. The display panel according to claim 6, wherein the first bottom surface comprises a third inclined surface, a fourth inclined surface, and a first sub-bottom surface connecting the third inclined surface and the fourth inclined surface, wherein a slope of the third inclined surface and a slope of the fourth inclined surface are equal in magnitude, wherein an extending surface of the third inclined surface and an extending surface of the fourth inclined surface intersect on a side of the first sub-bottom away from the substrate, wherein the third inclined surface connects the first inclined surface and the first sub-bottom surface, and wherein the fourth inclined surface connects the second inclined surface and the first sub-bottom surface.

8. The display panel according to claim 7, wherein a distance from the lowest point of the first bottom surface to a plane where the side wall of the groove closest to the lowest point is located is smaller than a sum of the thickness of the first conductive part and the thickness of the second conductive part.

9. The display panel according to claim 8, wherein the distance from the lowest point of the first bottom surface to the plane where the side wall of the groove closest to the lowest point is located is smaller than the thickness of the first conductive part.

10. The display panel according to claim 7, wherein a width of the first bottom surface is greater than a width of any one of the first inclined surface and wherein the second inclined surface in a plane perpendicular to an extending direction of the groove.

11. The display panel according to claim 7, wherein widths of the first inclined surface and the second inclined surface in a plane perpendicular to an extending direction of the groove are smaller than 3 times a total thickness of the first conductive part and the second conductive part.

12. The display panel according to claim 11, wherein widths of the first inclined surface and the second inclined surface in the plane perpendicular to the extending direction of the groove are smaller than the total thickness of the first conductive part and the second conductive part.

13. The display panel according to claim 8, wherein each groove comprises two side walls and a bottom wall connecting the two side walls, wherein the bottom wall comprising a fifth inclined surface, a sixth inclined surface, and a sub-bottom wall connecting the fifth inclined surface and the sixth inclined surface, wherein a slope of the fifth inclined surface and a slope of the sixth inclined surface are equal in magnitude, and wherein an extending surface of the fifth inclined surface and an extending surface of the sixth inclined surface intersect on a side of the sub-bottom wall away from the substrate.

14. The display panel according to claim 13, wherein in a plane perpendicular to an extending direction of the groove, a width of the fifth inclined surface is smaller than a width of the first inclined surface, and a width of the sixth inclined surface is smaller than a width of the second inclined surface.

15. The display panel according to claim 14, wherein in the plane perpendicular to the extending direction of the groove, the width of the fifth inclined surface is smaller than a width of the third inclined surface and the width of the sixth inclined surface is smaller than a width of the fourth inclined surface.

16. The display panel according to claim 3, further comprising:

a pixel definition layer comprising a plurality of openings corresponding to the plurality of first electrodes, respectively, and a plurality of second depression parts corresponding to the plurality of grooves, respectively, wherein each opening exposes at least a part of the corresponding first electrode, and each first depression part covers the side wall and bottom wall of the corresponding groove and extends to the first electrodes located on both sides of the corresponding groove; and a light-emitting functional layer located between the pixel definition layer and the second electrode, the light-emitting layer covering the pixel definition layer and the parts of the first electrode exposed by the plurality of openings.

17. The display panel according to claim 1, wherein the first conductive part comprises:

one or both of a flat layer and a buffer layer on the substrate; and a reflective layer on one or both of the flat layer and the buffer layer.

18. A display device comprising the display panel according to claim 1.

* * * * *